United States Patent [19]

Vester

[11] Patent Number: 5,777,475
[45] Date of Patent: Jul. 7, 1998

[54] AUTOMATIC IMPEDANCE ADAPTER FOR A H.F. EMITTER OR RECEIVER IN A NUCLEAR SPIN TOMOGRAPHY INSTALLATION AND PROCESS FOR OPERATING THE DEVICE

[75] Inventor: Markus Vester, Erlangen, Germany

[73] Assignee: Siemens Aktiengesellschaft, Munich, Germany

[21] Appl. No.: 669,277

[22] PCT Filed: Dec. 6, 1994

[86] PCT No.: PCT/DE94/01449

§ 371 Date: Jun. 20, 1996

§ 102(e) Date: Jun. 20, 1996

[87] PCT Pub. No.: WO95/17683

PCT Pub. Date: Jun. 29, 1995

[30] Foreign Application Priority Data

Dec. 21, 1993 [DE] Germany ............... 43 43 700.1
Nov. 23, 1994 [DE] Germany ............... 44 41 754.3

[51] Int. Cl.$^6$ .................................................. G01R 33/36
[52] U.S. Cl. ................................................................ 324/322
[58] Field of Search .................................. 324/300, 307, 324/316, 318, 322, 645; 128/653.2; 343/860, 861, 745; 333/17.3, 32; 455/121, 123, 125; 600/410, 422

[56] References Cited

U.S. PATENT DOCUMENTS

| | | | |
|---|---|---|---|
| 4,375,051 | 2/1983 | Theall | 333/17 |
| 4,621,242 | 11/1986 | Theall, Jr. et al. | 333/17 M |
| 4,827,219 | 5/1989 | Harrison | 324/322 |
| 4,951,009 | 8/1990 | Collins et al. | 333/17.3 |
| 5,079,507 | 1/1992 | Ishida et al. | 324/645 |
| 5,187,454 | 2/1993 | Collins et al. | 333/17.3 |
| 5,208,537 | 5/1993 | Rietsch et al. | 324/322 |
| 5,225,847 | 7/1993 | Roberts et al. | 343/745 |
| 5,483,158 | 1/1996 | Van Heteren et al. | 324/318 |
| 5,502,387 | 3/1996 | McGill | 324/318 |
| 5,564,086 | 10/1996 | Cygan et al. | 455/126 |

FOREIGN PATENT DOCUMENTS

| | | |
|---|---|---|
| 93201255 | 11/1993 | European Pat. Off. |
| 38 15567 | 11/1988 | Germany. |
| 40 35994 | 5/1992 | Germany. |
| 61-31978 | 2/1986 | Japan. |
| 3-51038 | 3/1991 | Japan. |

OTHER PUBLICATIONS

M. Peric, "Simple RF Matching For NMR Coils In ENDOR Spectrometers," Journal of Physics E.Scientific Instruments, pp. 700–701, Bd. 14, No. 6, Jun. 1, 1981.

A Funk, "A Pulse Reflectometer For Routine Monitoring Of Transmitted And Reflected Power In Physiological NMR Studies," Magnetic Resonance In Medicine, pp. 175–178, Feb. 1, 1987.

Primary Examiner—Sandra L. O'Shea
Assistant Examiner—Michael Eisenberg
Attorney, Agent, or Firm—Kenyon & Kenyon

[57] ABSTRACT

A device for automatic impedance matching of an RF transmitter or receiver in a nuclear spin tomography installation, and method for operating the device. The impedance matching device contains an RF transmitter or receiver which is coupled via a matching circuit having two actuators to a transmitting or receiving antenna respectively. Furthermore, the device has a circuit for detecting the complex reflection factor at the input of the matching circuit as well as an electronic control device with calculating circuits for adjusting the actuators. According to the invention, the calculating circuits contain units for calculating the complex reflection factor of the antenna from the detected complex reflection factor, and for calculating the setting points of the actuators for a reflection factor of zero at the input of the matching circuit. The electronic control device also includes units for storing the actuating characteristics of the actuators and the interactions in a matching network which is regarded as a linear four-port network, of the matching circuit.

14 Claims, 3 Drawing Sheets

AUTOMATIC IMPEDANCE ADAPTER FOR A H.F. EMITTER OR RECEIVER IN A NUCLEAR SPIN TOMOGRAPHY INSTALLATION AND PROCESS FOR OPERATING THE DEVICE

This is a 371 of application Ser. No. PCT/DE94/01449 filed on Dec. 6, 1994.

FIELD OF THE INVENTION

The present invention relates to a device in a nuclear spin tomography installation for automatic impedance matching of a high-frequency (HF) transmitter or receiver to a coupled transmitting or, respectively, receiving antenna, and to a method of operating same.

BACKGROUND INFORMATION

German Published Patent Application No. 40 35 994 describes a matching device for use in a nuclear spin tomography installation for providing automatic impedance matching for HF systems and antennas.

In a nuclear spin tomography installation, the required high-frequency (HF) (or radio frequency, RF) transmitter or receiver must be connected respectively to a transmitting or receiving antenna representing a load or source. However, the impedance of this antenna is not constant. The reason for this change in impedance is the interaction (loading) of the latter with different test objects, in particular patients. On the other hand, however, the transmitter or receiver is to be operated at a specific impedance, optimum for them, of 50Ω, for example, in order to have power matching in the transmitting case and noise matching in the receiving case. Consequently, it is usual to provide between the transmitter or receiver and the receiving or transmitting antenna, respectively, a variable matching circuit which, however, must be preset for each load impedance. Typically provided in the matching circuit for this purpose are two actuators, for example variable capacitors, which permit the active component and reactive component of impedance to be influenced. Depending on different test objects, however, the settings of these actuators have to be determined anew in each case.

For the purpose of this determination of the optimum setting points, the absolute value of the reflection factor into the matching network is continuously measured during a tuning procedure on the line between the transmitter or receiver and the network of the matching circuit. In this case, the actuators are adjusted systematically by hand or with an automatic device until the absolute value of the reflection factor is sufficiently small, for example below 5%. The optimum setting is then approximately achieved (compare the above named German Offenlegungsschrift).

During the search, many settings of the actuators must be thoroughly tested and a corresponding number of measurements must be carried out. This is bound up with a correspondingly high outlay on time, in particular when mechanically operated actuators are used. Again, the relationship between the setting points and the absolute value of the reflection factor is frequently not easy to predict, since it depends not only on the selected circuit and design of the network of the matching circuits, but also on the unknown antenna impedance. This complicates the systematic search for the optimum setting.

SUMMARY OF THE INVENTION

The present invention is directed to a device in a nuclear spin tomography installation for automatic impedance matching of a high-frequency (HF) (or radio frequency, RF) transmitter or receiver to a coupled transmitting or, respectively, receiving antenna, via a variable matching circuit which contains a matching network and two adjustable actuators connected thereto. The device has means for detecting the reflection factor at the input, facing the transmitter or receiver, of the matching circuit while the antenna interacts with a test object, and an electronic control device having means for calculating and adjusting the setting points of the actuators.

An object of the present invention is to provide such a matching device which overcomes the above-discussed shortcomings in the prior art. In particular, the aim is to make quick semi or fully automatic impedance matching possible for arbitrary test objects. In addition, a method is to be specified for operating such a matching device.

The following features are provided in the matching device according to the present invention:

1) the matching network is assigned to the calculating means of the control device as a linear four-port network having the input and output and the two connecting points of the actuators as the four ports, 2) the calculating means comprise at least one calculating unit for determining the complex reflection factor of the antenna from the complex reflection factor at the input of the matching circuit, as well as for determining the setting points, which are to be selected, of the actuators for a complex reflection factor of at least approximately zero at the input of the matching circuit while taking account of the complex reflection factor of the antenna, 3) the calculating means contain
   a) a first memory unit for storing the actuating characteristic of each actuator in the form of the relationship between a setting point applied to the respective actuator and the impedance thereof, and
   b) a second memory unit for storing the electrical interactions in the matching network in the form of a four-port matrix.

The advantages of this configuration of the matching device are to be seen, in particular, in that after a single measurement of the complex impedance or of the complex reflection factor, directly associated therewith, the desired reflection factor of the matching circuit can be set directly at the input thereof, superfluous adjusting steps and time delays bound up therewith being avoided. This is rendered possible by virtue of the fact that, by contrast with the known embodiment according to German Published Patent Application No. 40 35 994, the entire calculation involves the complex reflection factor of the antenna interacting with the test object. It is always possible to use the same calculation specification for matching networks with an entirely different circuit and design; all that is required is to store other matrix elements. Losses and undesired reactances in the matching circuit can also be taken into account in the matrix elements; they then have no influence on the accuracy of the matching results.

The matching device according to the present invention can advantageously be operated such that the following steps are carried out sequentially or, if appropriate, also at least partially simultaneously:

a) The complex reflection factor is measured at the input of the matching circuits using arbitrarily prescribed setting points of the actuators, b) the measurement result relating to this reflection factor is detected by the control unit, the calculating means of the latter making available the information relating to i) the setting points, present in step a), of the actuators,
ii) the relationship between the setting point of the respective actuator and the impedance thereof and
iii) the mutual interactions of the connection partners in the matching network, c) the calculating means of the control unit are used to determine the complex reflection factor of the antenna from the complex reflection factor, determined in step a), together with the information, made available in accordance with step b), relating to the complex reflection factor d) the calculating means of the control unit are used, taking account of the complex reflection factor, determined in step c), of the antenna, to determine new setting points of the actuators which lead to a complex reflection factor of at least approximately zero at the input of the matching circuit, and e) the new setting points determined in step d) are used for resetting the actuators, (to the extent that the new setting points determined in step d) do not correspond to the setting points prescribed in step a).

The above-discussed advantages can be realized in a particularly simple way with the method and device of the present invention.

DETAILED DESCRIPTION

Figure 1:
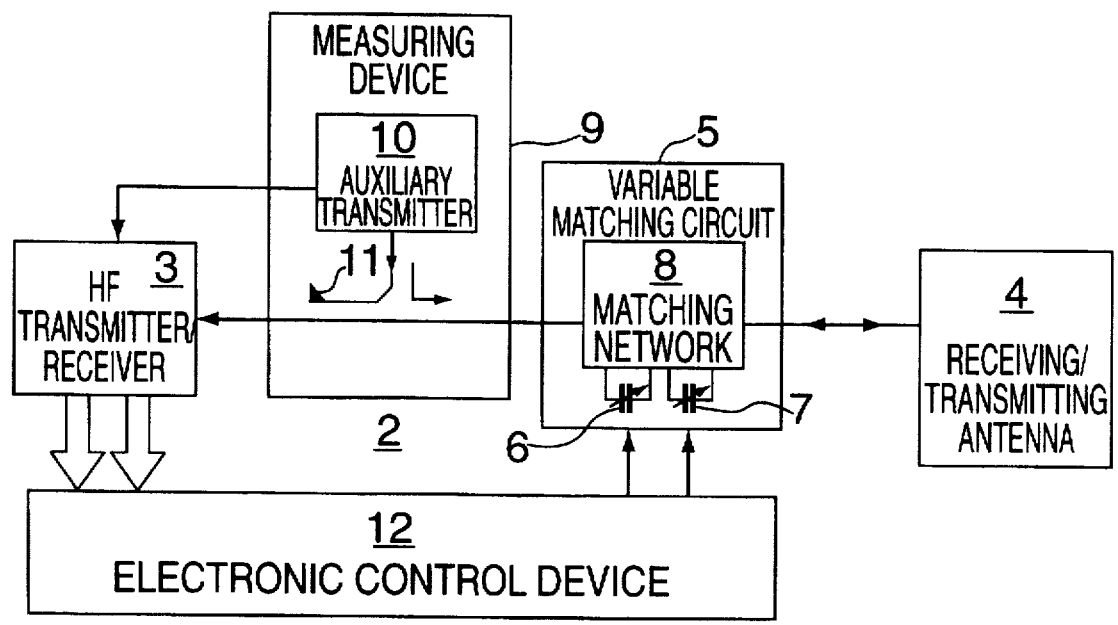
FIG. 1 shows the design principle of a matching device according to the present invention.

FIG. 1 shows a matching device 2 in accordance with a preferred embodiment of the present invention. FIG. 1 shows an HF transmitter or receiver 3, a receiving or transmitting antenna 4, a variable matching circuit 5 with actuators 6 and 7, a matching network 8 connected to said actuators, a measuring device 9 for reflection factor measurement, an auxiliary transmitter 10 as part of the measuring device 9, a directional coupler 11 connected to the measuring device 9, and an electronic control device 12 having calculating means (computer).

The connecting paths present between the individual parts of the device 2 are provided with arrows which are intended to illustrate the signal paths during the matching or tuning procedure. As assumed below, the actuators can be two capacitors which can be set by motor. However, it is also possible, for example, to provide variable capacitance diodes or switchable inductors for these actuators.

At the start of the tuning procedure, the measuring device 9 is used once to measure the complex reflection factor with respect to absolute value and phase. Of course, instead of the complex reflection factor it is also possible to consider the complex impedance, which is directly associated therewith. The complex reflection factor may form the general basis below. In order to determine this reflection factor, use can also advantageously be made of the receiver provided for the image generation in the nuclear spin tomography installation, for example. In accordance with German Published Patent Application No. 40 35 994, the signal of a low-power auxiliary transmitter 10 is coupled for this purpose into the receiving line via a directional coupler 11. The measurement result is a complex number which is detected by the control device 12, which has a computer. During measurement, the actuators 6 and 7 may initially be in an arbitrary setting which is, however, known to the computer of the control device, for example in the old setting from an earlier tuning operation. According to the invention, the relationship between the setting point and the impedance, which relationship is to be seen as respective characteristic, is stored in the computer of the control device for each of the two actuators, for example in the form of two tables. Furthermore, the computer advantageously need be prescribed (store) only the interaction, occurring in the matching network 8, between the electrical variables present at the connecting ports, without the need to take account individually of the concrete inner structure of the matching network 8. Consequently, according to the invention the matching network is prescribed as a linear four-port network, for example by means of an admittance matrix or a scattering matrix or by means of a mixed form of the two matrices with 4×4 complex elements.

By virtue of this and the known setting of the actuators during measurement, the transforming properties of the entire matching circuit 5 can be calculated during measurement. From these and the measured reflection factor, the computer can then firstly determine the complex impedance (complex reflection factor) of the antenna, and thus subsequently work out the setting of the actuators which leads to the desired matching. This purpose can be served by the computing method described below as an exemplary embodiment, on the basis of the matching circuit 5 in a four-port network representation. Of course, other computing methods having another four-port network representation can also be used. It is also possible not, as assumed below, to carry out the calculating process in two steps following one another in time, but to execute these steps at least partially simultaneously. Finally, the actuators 6 and 7 are brought into the calculated positions via stepping motors by the control device 12.

Figure 2:
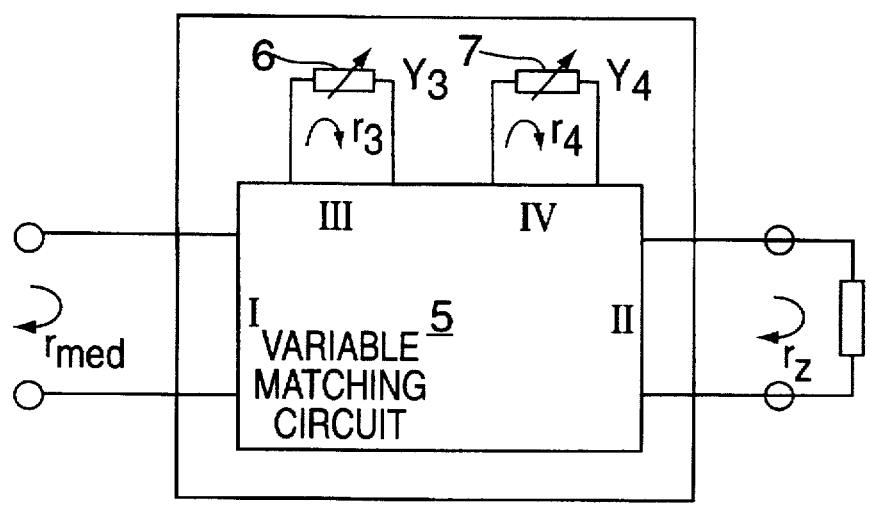
FIG. 2 shows an embodiment of a matching circuit of the device of the present invention in a four-port representation.

Reference may be made below to FIG. 2 for matching unknown load impedances via an arbitrarily prescribable network having two actuators. In this case, four ports are denoted by I to IV, the admittances of the actuators 6 and 7 are denoted by $Y_3$ and $Y_4$, the measured reflection factor (impedance) at the input (port I) of the matching circuit 5 is denoted by rmeas, and the impedance of the unknown load at the antenna 2 is denoted by $r_2$. The input of the matching circuit is to exhibit the reflection factor $r_c$ (usually zero) at the end of the setting operation.

Let the matching circuit 5 be a linear two-port network between the RF transmitter or receiver at port I and an unknown load of the antenna at port II. The complex reflection factor (impedance) into port I can be measured. Losslessness and reciprocity are not preconditions.

The matching circuit 5 is to be constructed as a matching network 8 which apart from ports I and II is to have two further ports III and IV to which two variable admittances $Y_3$ and $Y_4$ (or corresponding impedances $Z_3$ and $Z_4$) are connected as actuators 6 and 7 (for example, in the form of variable capacitors). Let the connecting four-port network be known and described, for example, by a scattering matrix (S). Other network matrices are also suitable, such as the admittance matrix (Y) or a mixed form such as wave parameters for ports I and II and admittance representation for ports III and IV.

Consider a measurement $r_{meas}$ of the input reflection factor into port I for an arbitrary, but known setting of $Y_3$ and $Y_4$. The aim is to find a setting of $Y_3$ and $Y_4$ which leads to matching to port I.

Figure 3:
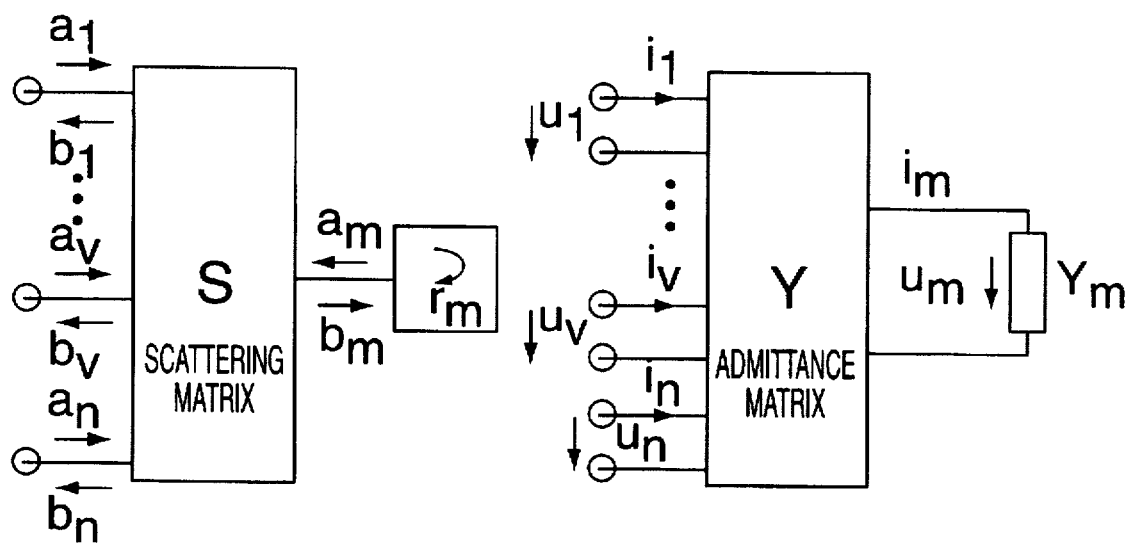
FIG. 3 shows a block diagram of an n-port network with a scattering or admittance matrix.

The following procedure is adopted for this purpose: The unknown load $r_2$ must be determined in a first step. To this end, the equations for ports III and IV, which are terminated by known reflection factors $r_3$ and $r_4$, must be eliminated from the network matrix. The method described below with reference to FIG. 3 is used for this purpose. In this figure, the incoming wave parameters are denoted by $a_\nu$, the outgoing wave parameters by $b_\nu$, the clamping voltages by $u_\nu$ and the currents by $i_\nu$ (where, in each case, $1 \leq \nu \leq n$ and $\nu \neq m$). The method permits an n-port (in the concrete case here, n=4 . . . 1) whose mth port is provided with a known terminating element rm to be used to calculate a remaining (n–1)-port by eliminating the equations for the mth port.

A scattering matrix (S) describes a system of equations of type $$b_\nu = \sum_{\mu \neq m} s_{\nu\mu} a_\mu + s_{\nu m} a_m$$

$$b_m = \sum_{\mu \neq m} s_{m\mu} a_\mu + s_{mm} a_m$$

The known reflection factor $r_m$, which is connected to a port m, necessitates that $a_m = r_m b_m$; that is to say $$b_m = a_m r_m^{-1}$$

$$a_m r_m^{-1} = \sum_{\mu \neq m} s_{m\mu} a_\mu + s_{mm} a_m$$

$$\Rightarrow a_m = k_m \sum_{\mu \neq m} s_{m\mu} a_\mu, \text{ where } k_m = 1/(r_m^{-1} - s_{mm})$$

Substitution in the remaining equations yields $$b_\nu = \sum_{\mu \neq m} s_{\nu\mu} a_\mu + s_{\nu m} k_m \sum_{\mu \neq m} s_{m\mu} a_\mu = \sum_{\mu \neq m} (s_{\nu\mu} + k_m s_{\nu m} s_{m\mu}) a_\mu.$$

These n−1 equations describe an (n−1) port network with a scattering matrix S' which no longer contains the mth port. Its scattering matrix elements are thus $$s'_{\nu\mu} = s_{\nu\mu} + k_m s_{\nu m} s_{m\mu}$$

In the following representation, we shall choose $\nu'=\nu$ and $\mu'=\mu$ in order to preserve unique port designations. However, it would also be possible for the purpose of simplifying the programming to reselect the indexing of the remaining ports, for example in accordance with $\nu'=\nu$ for $\nu<m$; $\nu'=\nu-1$ for $\nu>m$ and $\mu'=\mu$ for $\mu<m$; $\mu'=\mu-1$ for $\mu>m$.

In the admittance representation, the elimination of an admittance $Y_m$ connected to the mth node proceeds in an entirely analogous fashion. The exciting variables $a_\mu$ are replaced by $u_\mu$, and the system responses $b_\nu$ by $i_\nu$. The admittance connected to the node m necessitates $u_m=(1/-Y_m)i_m$ in a fashion analogous to $a_m=r_m b_m$.

Accordingly, in the equation for km, the factor $r_m^{-1}$ is to be replaced by $-Y_m$:

$$y'_{\nu\mu} = y_{\nu\mu} + k_m y_{\nu m} y_{m\mu},$$

where $k_m=1/(-Y_m-y_{mm})$.

If ports III and IV in the matching circuit 5 have been eliminated in this way, a two-port network remains between I and II. In order to determine the unknown terminating element $r_2=a_2/b_2$ from the measured reflection factor $r_{meas}=b_1/a_1$, the elimination method can also be reused with the aid of a special method step. Specifically, the measuring instrument can be notionally replaced by an active terminating element with $r_1=1/r_{meas}$, without there being any change in the network. Said active terminal element is eliminated, leaving over the active one-port network with $S_{22}'=b_2/a_2$. The physically present load reflection factor can thus be worked out directly with $r_2=a_2/b_2=1/s_{22}'$.

In a second step, it is now necessary to determine the manipulated variables $Y_3$ and $Y_4$ required for matching $b_1/a_1=0$. In accordance with the above-mentioned special method step, $r_1=1/r_z=1/0$ is now eliminated This corresponds to a connected admittance of $-(1/50\Omega)$. The division by zero need not be carried out in actual fact, since only $1/r_m$ occurs in $k_m$, that is to say $k_1=1/-s_{11}$. The elimination of $r_1$ need not be performed anew for each matching operation; the resulting three-port network (II, III, IV) can also be calculated once in advance.

$r_2$ is then eliminated, leaving an active two-port network between port III and port IV. It is therefore possible to eliminate port III for each manipulated variable $Y_3$ and $r_3$ respectively, and to determine the associated value r4 or $Y_4$:

$$1/r_4 = s_{44}' = s_{44} + s_{34} s_{43}/(r_3^{-1}-s_{33}) \Rightarrow (r_3^{-1}-s_{33})(r_4^{-1}-s_{44}) = s_{34} s_{43}$$

or, expressed in admittances:

$$(Y_3+y_{33})(Y_4+y_{44}) = y_{34} y_{43}.$$

Since $Y_3$ and $Y_4$ may not assume every complex value, but can be adjusted only in one degree of freedom each, the result is only specific realizable value pairs $Y_3-Y_4$.

In the general case, $Y_3(p_3)$ is an arbitrary prescribed complex function of a real actuating parameter $p_3$, likewise for $Y_4(p_4)$. In a computational search strategy, it is then necessary for p3 to be varied systematically until $Y_4$ calculated from $Y_3(p_3)$ is situated in the value range of $Y_4(p_4)$.

However, the losses of real tuning elements (for example, the series resistance of variable capacitance diodes) can almost always be integrated into the connecting four-port network. If the actual $Y_3$ and $Y_4$ are thereby lossless, the calculation of their imaginary parts $B_3$ and $B_4$, which are present alone, can be performed directly analytically. The real and imaginary parts of the admittance relationship yield two equations for $B_3$ and $B_4$, which lead to a maximum of two realizable solution pairs:

$$Re((jB_3+y_{33})(jB_4+y_{44})) = Re(y_{34} y_{43})$$

$$Im((jB3+y_{33})(jB_4+y_{44})) = Im(y_{34} y_{43}).$$

The result for $y_{vp} = G_{vp} + jB_{vp}$ and $B_3' = B_3 +$ $B_{33}$ and $B_4' = B_4 + B_{44}$ is Re: $G_{33}G_{44} - B_3'B_4' = G_{34}G_{43} - B_{34}B_{43}$ Im: $G_{33}B_4' + G_{44}B_3' = G_{34}B_{43} + G_{43}B_{34}$.

From Im: $B_4' = (G_{34}B_{43} + G_{43}B_{34} - G_{44}B_3')/G_{33}$ in Re: $G_{33}G_{44} - B_3'(G_{34}B_{43} + G_{43}B_{34} - G_{44}B_3')/G_{33} - G_{34}G_{43} + B_{34}B_{43} = 0$ => $B_3'^2 - B_3'(G_{34}B_{43} + G_{43}B_{34})/G_{44} + (G_{33}G_{44} - G_{34}G_{43} + B_{34}B_{43})G_{33}/G_{44} = 0$ with $p = -(G_{34}B_{43} + G_{43}B_{34})/G_{44}$ and $q = (G_{33}G_{44} - G_{34}G_{43} + B_{34}B_{43})G_{33}/G_{44}$ the two solutions being sought for $B_3$ and the respectively associated $B_4$ are:

$B_3' = -p/2 \pm SQR(p^2/4 - q)$;

$B_3 = B_3' - B_{33}B_4' = (G_{34}B_{43} + G_{43}B_{34} - G_{44}B_3')/G_{33}$;

$B_4 = B_4' - B_{44}$, with SQR=the mathematical square root sign.

Figure 4:
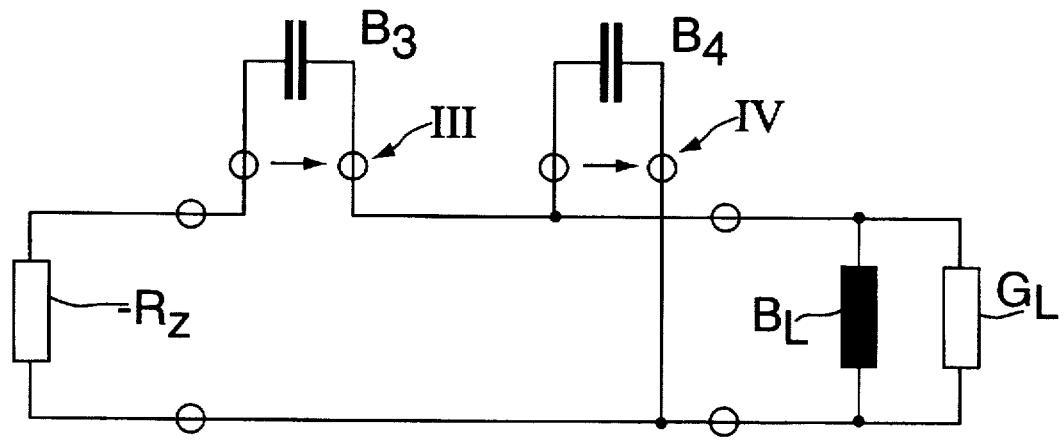
FIG. 4 shows an exemplary embodiment of the matching circuit of the present invention.

In accordance with FIG. 4, as a simple example $C_s$–$C_p$ matching circuit, known from German Published Patent Application No. 40 35 994, for example, for a high-resistance inductive load may be taken, after ports I and II have been eliminated in accordance with the method explained above. All the admittances have been standardized to $Z_0^{-1} = 1/50\Omega$. In the figure, $B_3$, $B_4$ denote the imaginary admittances of the actuators (capacitors), $B_2$ and $G_L$ denote the imaginary part or real part of the load admittance of the antenna, and $-R_z$ denotes the negative value of the desired (target) resistance (for example, of 50Ω) at the input of the matching circuit. The elements of the Y matrix can be specified directly from the circuit:

$y_{33} = -1; y_{34} = y_{43} = -1; y_{44} = -1 + G_L + jB_L$.

The calculation yields $p = 0; q = -G_L/(1-G_L)$ and, consequently, the two solutions only for $G_L < 1$ $B_3 \pm SQR(G_L/(1-G_L))$ $B_4 = -B_L \pm SQR(G_L/(1-G_L))$, the first of which is realized by $C_s = B_3/\omega Z_0$ and $C_p = B_4/\omega Z_0$.

Figure 5:
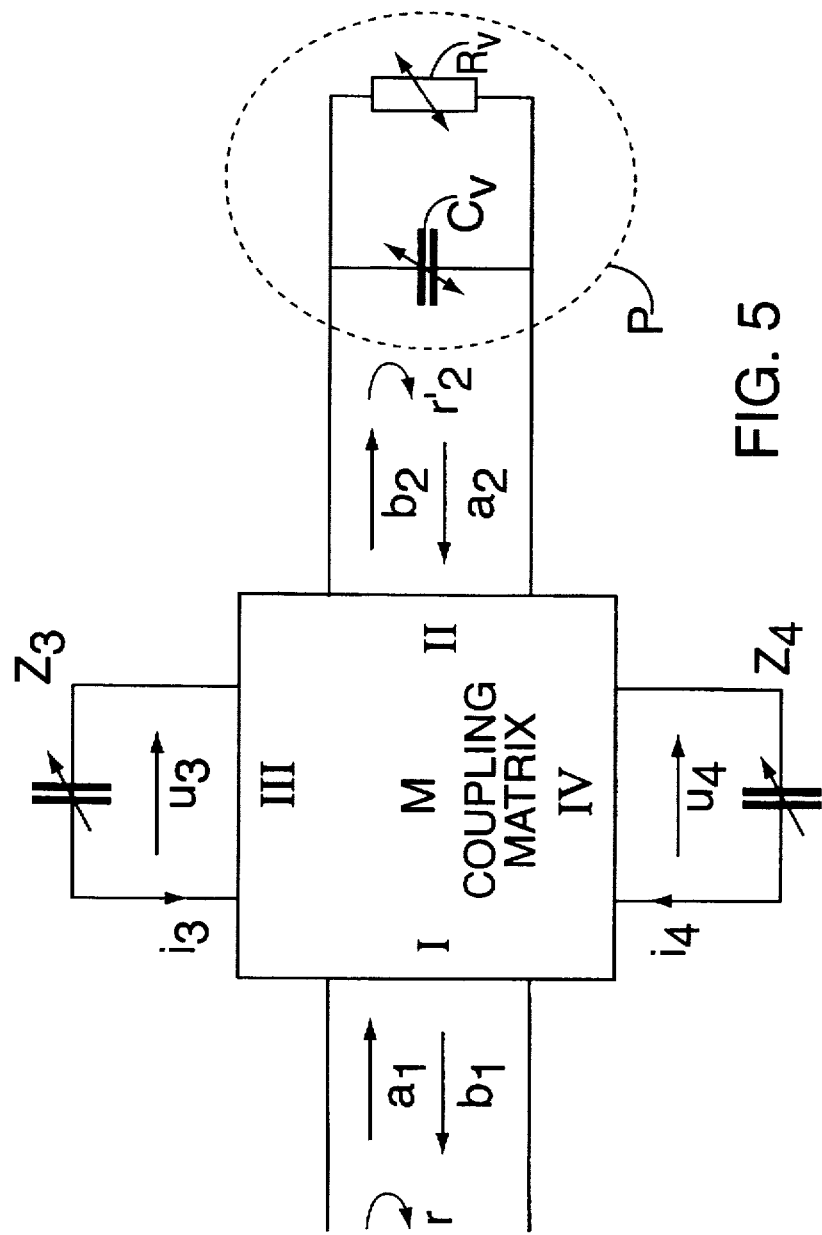
FIG. 5 shows a block diagram of a matching circuit in accordance with the present invention.

The general method, described with the aid of FIG. 2 and given concrete form in accordance with FIG. 4, for defining the matching circuit 5 is further explained below with the aid of FIG. 5. In the exemplary embodiment represented, the antenna coil used for transmission and/or reception, that is to say its fixed, unchanged part, can be notionally integrated into the matching network, with the result that only the effect of a test object or a patient P on the coil remains as variable load impedance $r_2$. This effect of the patient P is illustrated in the figure by a variable capacitor $C_v$ with a parallel variable resistor $R_v$. Furthermore, in the figure, Zi denotes the reactance at the port i, with III≦i≦IV. aj and bj denote wave parameters with 1<j<2. $i_3$, $i_4$ denote the currents at port III and port IV, respectively. $u_3$, $u_4$ denote the voltages at port III and port IV, respectively. r denotes the input reflection factor of the circuit, which initially is the measured reflection factor rmeas and finally the desired reflection factor $r_z$. $r'_2$ denotes the variable component of the reflection factor of the loaded antenna. M denotes a coupling matrix in the form of a four-port matrix in a mixed representation of wave parameters and admittance parameters.

The coupling matrix is part of a system of equations which can be described, for example, in the following way:

$$\begin{bmatrix} b1 \\ b2 \\ i_3 \\ i_4 \end{bmatrix} = M * \begin{bmatrix} a1 \\ a2 \\ u_3 \\ u_4 \end{bmatrix}$$

In principle, the procedure for configuring the matching circuit 5 can then be described by four steps a) to d):

a) Measuring r in conjunction with arbitrary known Z3, Z4 with $r = r_{meas}$.

b) Determining $r_2$ by eliminating Z3, Z4 and $r^{-1}$.

c) Eliminating $r_2$ and $r_z^{-1}$, where $r_z$=the desired "target" reflection factor, i.e., $r_z$, is reduced to zero. In this procedure, it is assumed that Z3 and Z4 are lossless. This assumption leads to solution pairs for $Z_3$–$Z_4$.

d) Selecting and setting a solution pair Z3–Z4.

While only a single embodiment has been described in detail, those skilled in the art will recognize that many variations and modifications can be made in such an embodiment while retaining many of the novel features and advantages of the present invention. All such modifications and variations are intended to be included within the scope of the appended claims.

I claim:

1. In a nuclear spin tomography installation, a device for performing an automatic impedance matching of a radio frequency apparatus to a coupled antenna via a variable matching circuit including a matching network coupled to a plurality of adjustable actuators, said device comprising:

means for detecting a reflection factor at an input of the variable matching circuit, wherein the matching network comprises a linear four-port network, a first port of said matching network corresponding to an input of the matching network, a second port of said matching network corresponding to an output of the matching network, a third port of said matching network corresponding to a first connection point of the plurality of actuators, and a fourth port of said matching network corresponding to a second connection point of the plurality of actuators; and control means, coupled to the means for detecting, for calculating an antenna reflection factor on the basis of the detected reflection factor and for adjusting a plurality of setting points corresponding to the plurality of actuators, the control means comprising:

a calculating unit for calculating:

the antenna reflection factor on the basis of the detected reflection factor, and the plurality of setting points of the actuators, the plurality of setting points being calculated so as to reduce the reflection factor at the input of the variable matching circuit substantially to zero;

a first memory unit for storing an actuating characteristic of each actuator in accordance with a relationship existing between a setting point of each actuator and an impedance of each actuator; and a second memory unit for storing electrical characteristics of the matching network as a four-port matrix.

2. The device of claim 1, wherein the adjustable actuators comprise a variable capacitor.

3. The device of claim 1, wherein the adjustable actuators comprise a variable capacitance diode.

4. The device of claim 1, wherein the adjustable actuators comprise an inductor.

5. The device of claim 1, wherein the radio frequency apparatus comprises a receiver.

6. The device of claim 1, wherein the radio frequency apparatus comprises a transmitter.

7. The device of claim 1, wherein the antenna comprises a receiving antenna.

8. The device of claim 1, wherein the antenna comprises a transmitting antenna.

9. The device of claim 1, wherein the means for detecting includes a measuring device comprising an auxiliary transmitter connected to a directional coupler.

10. The device of claim 1, wherein the four-port matrix comprises an admittance matrix.

11. The device of claim 1, wherein the four-port matrix comprises a scattering matrix.

12. The device of claim 1, wherein the four-port matrix comprises a combination of an admittance matrix and a scattering matrix.

13. In a nuclear tomography installation, a method of performing an automatic impedance matching of a radio frequency apparatus to a coupled antenna via a variable matching circuit including a matching network coupled to a plurality of adjustable actuators, each actuator being set to a predetermined setting point, said method comprising the steps of:

setting each of the plurality of adjustable actuators in accordance with an arbitrarily prescribed setting point;

measuring a complex reflection factor at an input of the matching circuit using the arbitrarily prescribed setting points of the adjustable actuators;

determining a relationship between the setting point and an impedance of each corresponding actuator;

determining electrical characteristics of the matching network;

calculating a complex reflection factor of the antenna on the basis of the measured complex reflection factor, the setting points of the actuators, the relationship between the setting points and impedances of the actuators and the electrical characteristics of the matching network;

calculating, on the basis of the complex reflection factor of the antenna, a new setting point for each of the plurality of adjustable actuators, the new setting points being calculated so as to reduce the complex reflection factor at the input of the matching circuit substantially to zero; and resetting the plurality of adjustable actuators in accordance with the new setting points.

14. The method according to claim 13, comprising the steps of:

converting a first four-port network describing the matching network to a single port network on the basis of the arbitrarily prescribed setting points and of the measured complex reflection factor at the input of the matching circuit, thereby obtaining the complex reflection factor of the antenna;

converting a second four-port network describing the matching network to a two-port network describing the matching network on the basis of the complex reflection factor of the antenna and of the reduced complex reflection factor at the input of the matching circuit;

calculating a first plurality of value pairs corresponding to the arbitrarily prescribed setting points on the basis of a mutual coupling existing between the arbitrarily prescribed setting points of the plurality of actuators and the two-port network.

* * * * *